United States Patent [19]

Lyon

[11] Patent Number: 4,660,198
[45] Date of Patent: Apr. 21, 1987

[54] DATA CAPTURE LOGIC FOR VLSI CHIPS

[75] Inventor: Terry L. Lyon, Roseville, Minn.

[73] Assignee: Control Data Corporation, Minneapolis, Minn.

[21] Appl. No.: 723,386

[22] Filed: Apr. 15, 1985

[51] Int. Cl.⁴ .................... G01R 31/28; G06F 11/00
[52] U.S. Cl. ................................ 371/15; 371/16; 371/20; 371/29
[58] Field of Search .............. 371/15, 16, 29, 20, 371/25; 364/200, 900; 324/73 R, 73 AT, 73 PC

[56] References Cited

U.S. PATENT DOCUMENTS

| | | | |
|---|---|---|---|
| 4,233,682 | 11/1980 | Liebergot | 371/68 |
| 4,357,703 | 11/1982 | Van Brent | 371/15 |
| 4,395,767 | 7/1983 | Van Brent | 371/25 |
| 4,554,661 | 11/1985 | Bannister | 371/15 |
| 4,578,773 | 3/1986 | Desai | 371/15 |
| 4,622,669 | 11/1986 | Pri-Tal | 371/25 |

Primary Examiner—Michael R. Fleming
Attorney, Agent, or Firm—J. A. Genovese; W. J. McGinnis; M. B. Atlass

[57] ABSTRACT

A circuit means for detecting data errors in VLSI processing circuits at the earliest point such an error occurs in the processing stream or (in different modes) at any selected point therein, and for providing the prior operands and faulty (intermediate) output data together with an indication of what is wrong with the data. Described are registers and/or means for controlling the mode of the circuitry, error detection means (being, for example, parity check circuits), and an output means for providing the output in an organized way responsive to the controlling means and the output of the error detecton means. The method of using such a circuit is inherent in the disclosure.

18 Claims, 2 Drawing Figures

DATA CAPTURE LOGIC FOR VLSI CHIPS

BRIEF DESCRIPTION OF THE DISCLOSURE

The present data capture logic system is placed into VLSI chip design as a test and error detection system over and above the data handling circuits necessary for the VLSI chip design. The present data capture logic system includes an input series of control registers which receives control operands which determine what functions of a variety of possible functions are performed by the data capture logic system. The control registers are connected with data capture registers associated only with the data capture logic system, multiplexers, and capture mode select and delay logic circuits. The capture mode select and delay logic circuits are connected with the registers and multiplexers which are in turn connected with various components of the VLSI logic system. The capture mode select and delay logic circuits control which operands are inserted into the data capture logic registers and the time at which such operands are captured. The data capture logic registers are connected to an output register which holds all of the output data capture logic information in parallel. Various selection networks control which operands are put into the output register. At the appropriate time signal, the data capture logic output operand is removed from the chip in serial fashion so that a minimal number of input and output pins are used in this system. Various test functions may be performed by setting the control operands differently. Various operands from the VLSI logic may be captured at different times during operation of the VLSI chip by setting various control operands. The basic design of the logic allows capture of operand signals at different times; thus, the input operand to a specific circuit may be captured as well as at a later time the output operand generated from the same input operand. The capture time delay allows a logic analyzer report to be made for a loop-type test sequence.

BACKGROUND OF THE INVENTION

The present invention relates to a data capture logic system to be used with very large scale integrated circuit chips, also known as VLSI chips, to provide test and error checking functions in addition to the operational functions of the chip. More particularly, the present invention relates to a data capture logic system which may be located on the VLSI chip and programmed to store certain operands from the VLSI logic function during operation, as well as storing operands at different time cycles during operation so that the functioning of the circuit may be analyzed. This invention has particular application to VLSI chips that have a pipeline or pipe sequence of operations.

The increasing complexity of logic design as implemented on VLSI chips has created problems with respect to the fact that large amounts of the circuitry contained within a single VLSI array cannot be directly sampled or tested. With very large arrays, a substantial number of logic or functional steps can occur between input operands and output operands so that if some types of error are present in the output operand, it is difficult to determine where or in what manner the error came about. The ability to test or otherwise determine the functioning of a logic circuit in a VLSI array is especially important during the design check-out process so that internal logic can be sampled to verify the logic design, as well as to identify "weak" areas in the array design or layout which might be especially sensitive to error development during the life of a VLSI chip. Such "weak" areas may have poor tolerance or margins to voltage fluctuation, timing variations or other factors. Therefore, it is important in VLSI logic design to create an internal system which can test or sample preselected, important data points internal to the logic structure. Because some errors are intermittent and do not occur under all conditions, but only under certain conditions, it is especially difficult to diagnose these errors in large systems. Diagnosis of intermittent errors can be especially aided if the failing input data at various positions internal to a logic circuit can be captured along with the input operands to the logic structure. Similarly, because input and output connections or pins to VLSI logic chip arrays are limited in number and primarily used for operational purposes, tests for error function logic must be allowed to take only a very small number of the input and output pins that can be placed on a VLSI chip.

Error checking and test logic is extremely important in VLSI design and, consequently, there is a substantial amount of prior art directed to this problem.

One known technique for analyzing VLSI logic design and error functions is known as the level sensitive scan design in which a substantial number of registers are combined with the logic system on a VLSI chip so that on demand the contents of all of the registers may be delivered in a continuous serial fashion to an output pin of the chip. This system requires the stringing together of a significant number of operand registers in the VLSI chip in order to output a substantial body of serial data. All of this data is captured at the same time and represents a burden to analyze all of the particular operands and unnecessary information captured by this method. Also, this method does not capture the correct input operands to correlate with operands in various processing steps.

Another method of VLSI chip design is represented by U.S. Pat. No. 4,233,682, which shows that a fault detection and isolation system can be designed using a substantial amount of duplicate logic in the system design combined with comparators at various stages of processing. As long as the comparators show that the processing steps are producing identical operands, then no error output is indicated. However, when the operands at a particular point in the logic function are not identical, then an error output is indicated and the correct operand is selected for output if it is possible to determine which operand is correct. This system creates the burden in logic design of duplicating all essential functions of the logic together with comparator logic for comparing the operands at various stages of processing. This design and the comparator logic will penalize the speed performance of the circuit. While this duplication of logic may be necessary in some applications, it should not be necessary for all applications. Also, this duplicate logic system may show that an error is occurring internal to a logic system, but does not help determine the type of error that is occurring by capturing both input and failing output operands from the same internal function.

A forerunner of the present data capture logic system is shown and described in U.S. Pat. No. 4,357,703 owned by the same assignee as the present invention. That patent showed that certain test functions could be performed with LSI logic and that input and output operands could be captured in parallel fashion in registers for serial shifting into and out of the chip for test purposes. This system was good for LSI level logic design but VLSI demands other techniques because of the high logic density on a chip. Moreover, that patent does not show a system for capturing data operands internally in the VLSI logic structure at different times during functioning of the VLSI logic.

SUMMARY OF THE INVENTION

The present data capture logic system provides for the selection of a particular test and sampling function from a variety of available test and sampling functions on a VLSI logic chip or array. In particular, the data capture logic function of the present invention allows for the preselection of a particular data capture time in a sequence of timed events for capture of data operands at particular points in the system, thus enabling the capture of preselected input operands to a logic function internal to the VLSI chip at an earlier time than the failing output operand from that same function, so that the type of functional failure may be analyzed even though the function is internal to the logic structure of the chip. In order to analyze failures, the present invention allows the preselected capture of the earliest failing operand in the logic structure.

The data capture logic of the present invention has an input control register, a data delay and multiplex network, an output shift register, and various control signal networks. Control operands are provided to the input register in serial fashion and may be moved from the input control register in parallel to control various holding registers which are part of the data capture logic system. The input register is loaded through the shift network and contains control information to clear errors, override multiplexer selections, and a delay factor control section to select the capture time of various operands. The data delay and multiplexing network contains the logic to select various data fields and to align these data fields in time sequence. The output shift register can be selected to contain error summary bits and the necessary captured data which will normally be a failing result with its input operands. The error summary bits identify the type of error and where it occurred in the system. Various miscellaneous signals are needed to control shifting into and out of the input and output registers, as well as signals for triggering data capture of data operands into the data capture operand holding registers. The basic concept of the data capture logic is that data will be selected into the output registers and captured until they can be serially shifted into a maintenance processor for error analysis. The preselected functions are controlled by the status of the control register.

IN THE FIGURES

FIGS. 1A and 1B, viewed in left to right order, are a schematic drawing of a logic circuit together with a data capture logic system according to the present invention.

DESCRIPTION OF THE PREFERRED EMBODIMENTS

Figure 2A:
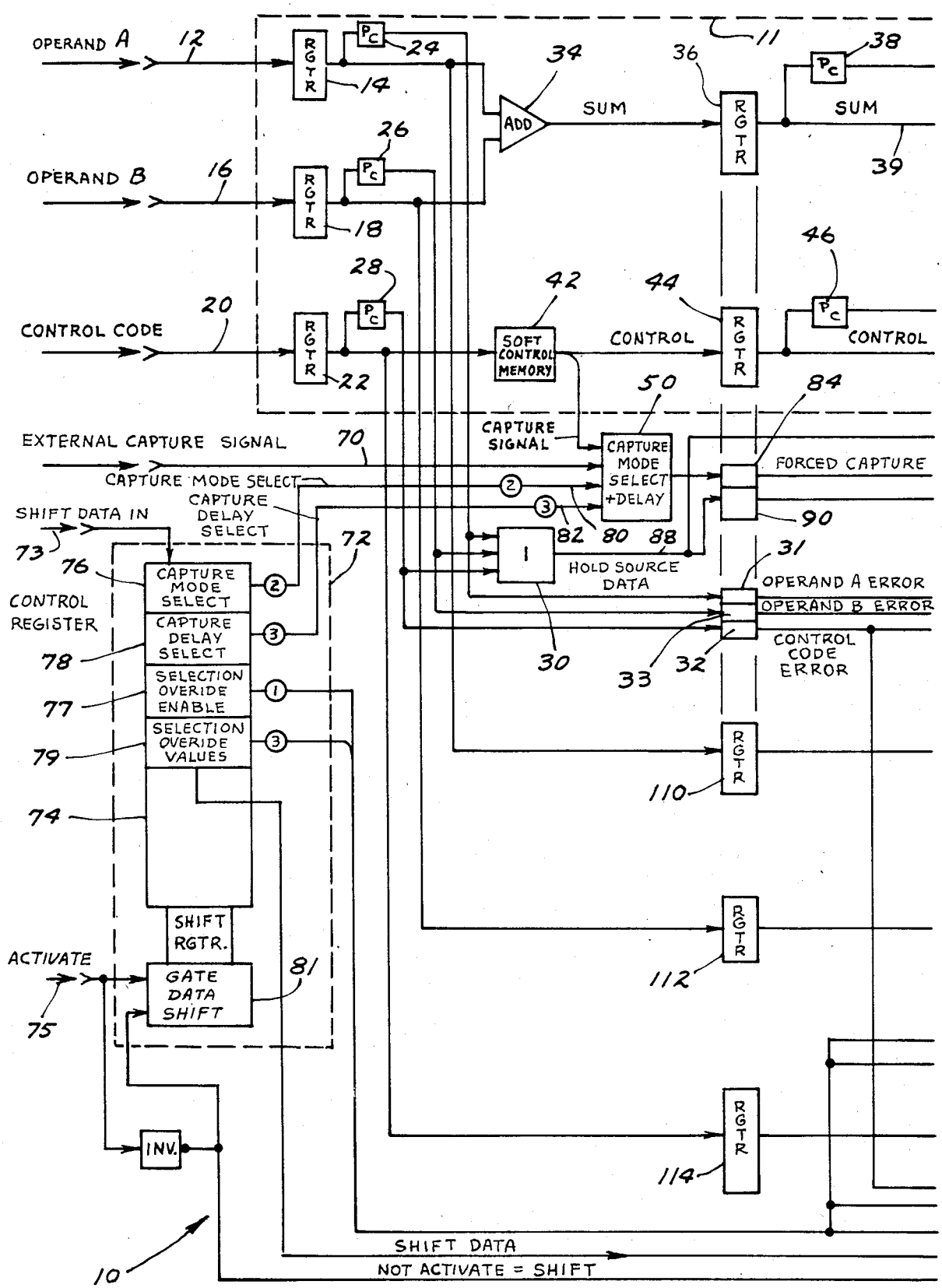
Figure 1B:
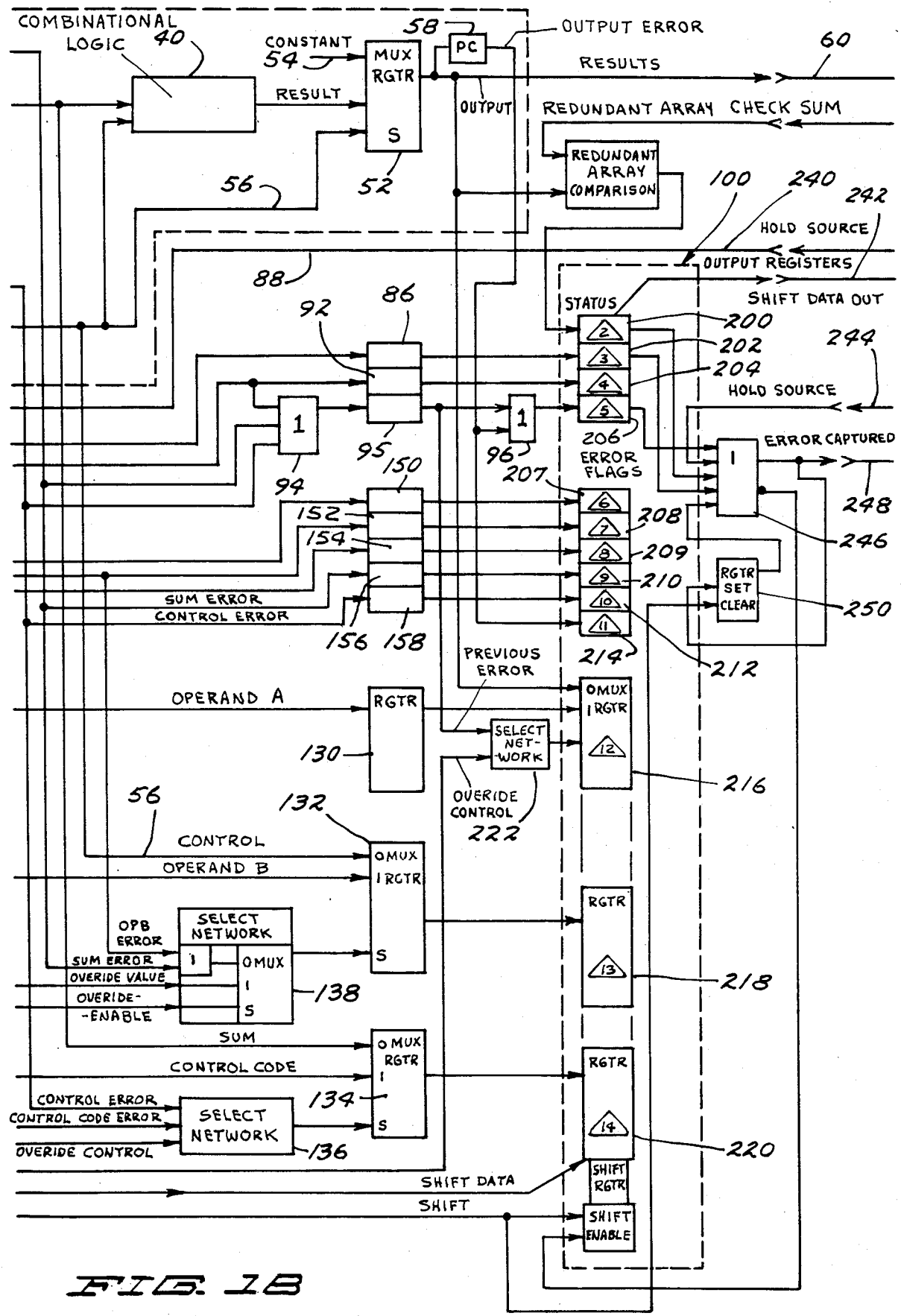

Referring now to FIGS. 1A and 1B, a combined VLSI logic array and data capture logic system 10 according to the present invention is shown. The VLSI logic array does not form a part of the present invention but the data capture logic according to the present invention can only be shown in connection with such a VLSI logic array. A sample gate logic array 11 is shown within dotted lines. Array 11 contains a pipe structure of sequenced operations.

An "A" operand is inputted in parallel through channel 12 to a register 14. A "B" operand is inputted in parallel through channel 16 to register 18. A control operand is provided through data channel 20 to a register 22. Associated with each register 14, 18, and 22 is a parity check circuit numbered, respectively, 24, 26, and 28. Each of the parity check circuits 24, 26, and 28 is connected respectively to a logic circuit 30 and to a register 32, the operation of which will be explained later.

Register 14 has an output connected as an input to adder 34. Register 18 has an output which is connected as the other input to adder 34. The output of the adder 34 is the sum of the "A" operand and the "B" operand which is connected to register 36. Register 36 has an associated parity check circuit 38 which has an output connected to additional circuits, as will be explained later. The output of register 36 is connected to an additional combinational logic circuit 40, which is part of the VLSI logic array. The combinational logic circuit 40 performs additional operations on operands it receives.

Register 22 is connected to a soft control memory 42, which stores the control operands it receives. The output of soft control memory 42 is connected to a register 44, which also has an associated parity check circuit 46. The output of register 44 is connected as an input to combinatinal logic cirucit 40. The output of soft control memory 42 is also connected with a capture mode select and delay logic circuit 50, which is part of the data capture logic circuit of the present invention as will be explained later.

The output result of combinational logic circuit 40 is connected to a multiplexer register 52, which selects inputs from different sources. One input to register 52 is indicated schematically as a constant on data line 54. This constant might be all binary 1's or all binary 0's, or some other appropriate constant, for use with the circuit. The control for the register 52 is provided on data channel 56 from the output of register 44. Multiplexer register 52 also has an associated parity check circuit 58. Finally, the output of register 52 is provided as an output to the VLSI logic chip on a data channel 60, which represents the results of the operations performed on the input operands.

The capture mode select and delay logic circuit 50 is an optional system for controlling the time of data capture. The soft control memory 42 has an input line to circuit 50, which can provide a capture signal to provide a capture of particular data at a predetermined time. In addition, an external capture signal can be provided on data channel 70 to control a particular capture of data from outside of the system. The specific data capture trigger is selected by channel 80 and the additional delay factor is selected by channel 82.

The input register system with its controls is shown generally within dotted line box 72. This input register system consists of a register having various sections into which data is serially shifted and from which data may be removed in parallel to drive various portions of the data capture logic system of the present invention. The first two sections of control register 74 are sections 76 containing the capture mode select logic, and section 78 containing the capture delay select logic. Section 76 provides a capture mode select signal on data path 80 to capture mode select and delay circuit 50 and capture delay select section 78 provides a signal on data channel 82 to the capture mode select and delay logic 50. The output of capture mode select and delay logic circuit 50 is connected to register 84 and provides a control signal to capture data. The output of register 84 is passed on to register 86.

Logic circuit 30 is an OR gate which receives inputs from parity check circuits 24, 26 and 28. If any one of the input registers shows an input parity error, then OR gate 30 is activated to produce a "hold source" data signal on data path 88 to register 90. Data path 88 also has an external output pin external to the VLSI logic chip, which indicates that input data to the chip is in error and that, therefore, the chip itself may not be the cause of the error. This signal on the output pin is sent to the VLSI logic chip(s) which is (are) sending the input data. This signal causes the data being sent to be captured and to keep it available for error analysis.

Register 90 has an output which is connected to a register section 92 and to an OR gate 94. Register section 92 has an output which goes to a section of an output shift register 100, which will be described later. OR gate 94 also receives inputs from the outputs of parity check circuits 38 and 46, any one of which can activate the output of the OR gate. Registers 110, 112 and 114 receive inputs from input registers 14, 18 and 22, respectively, and capture the contents of these input registers.

The function of the error status registers 31, 32 and 33 is to allow the capture of the data represented at the time of the first error rather than subsequent errors. Subsequent error information might be totally irrelevant or confusing in terms of analysis. Thus, the control mechanism functions at the first parity check error or the first error of other types in order to capture the input operands and the failing data occurring the first time an error is triggered.

Register 110 has an output connected to register 130 for passing the "A" operand forward in the pipe. Similarly, register 112 is connected to multiplex register 132 for passing the "B" operand to multiplex register 132 when it is selected. Register 132 has an additional input of data from data path 56, which comes from register 44 and can represent the capture of data at a different point in the operational process. Register 132 has a select network 138 which produces selection control signals to determine which operand is selected to be stored in a particular data capture situation. Similarly, register 114 is connected to a multiplex register 134 for passing the control operand forward. Multiplex register 134 has a second data input which is connected to data path 39, which connects register 36 to combinational logic unit 40. A select network 136 controls the operation of multiplex register 134 and has various inputs that select the conditions by which the operand held in register 134 is selected.

Combinational logic unit 40 may be used to perform any desired type of function and is shown to indicate that there will be additional logic steps on the VLSI logic chip. For example, combinational logic network 40 might be a masking network, exclusive ORs, AND gates, or whatever, that performs some desired logic function. This unit 40 does not contain registers, however, because registers would be connected to the data capture logic system of the present invention.

The intention and scope of this invention is that it could be used with a more complex VLSI logic system than is shown. The system could have more data capture registers of the sort shown, for example, by registers 110, 112 and 114, and additional data capture multiplex registers like registers 132 and 134, where a choice of inputs can be selected depending on the type of data capture that is desired in the system. Similarly, select networks 136 and 138 can operate to select different operands in the system depending on various selected input control signals. These are shown by way of example only, to indicate the types of data capture modes that are available, but not to limit the system with respect to other possible modes of data capture.

For example, select network 136 receives a control error signal from parity check network 46 if there is an error in the operand in register 44. This can then be used to select, for example, the operand coming out of register 44 for data capture purposes. Similarly, select network 136 has a control code error input from device 32, which represents an error in the parity check network 28 associated with control code input register 22. This can have a different function for retaining captured data from a previously detected error at a different level of input to the system.

Finally, input control register 72 has both sections 77 which provides a selection override enable signal, and section 79 which provides selection override values. Sections 77 and 79 have outputs which are connected with both selection networks 136 and 138. If the override control is activated to select network 136, then other values can be selected to be captured based on these external control signals regardless of the output conditions of parity check networks 46 and 28, for example. Similarly, select network 138 has as inputs an override enable signal and an override value signal which forces the selection and capture of a predetermined field of data. This allows for the capture of operands at a different time sequence than other operands, or for the capture of operands other than the preselected default operands in the same time period.

Control device 95 is connected to receive the output of OR gate 94. OR gate 94 receives information from parity check devices 38 and 46, as well as the hold source data signal from device 90, when activated. Thus, if OR gate 94 is activated, a signal is placed into control block 95 associated with registers 130, 132 and 134. These control blocks give status information on the data captured in these registers and will be used to make data selections at the next period in time. OR gate 96 is in turn connected to receive signals from control 95 and parity checker 58.

Control blocks 150, 152, 154, 156 and 158 are also associated with the control of data capture registers 130, 132 and 134. Control blocks 150, 152 and 154 receive the indicated signals from control blocks 31, 32 and 33 associated with registers 110, 112 and 114. Thus, the passing on of the control signals from one set of control blocks to another can provide for either simultaneous data capture at the different positions or sequenced data capture. In addition, control block 156 is associated with a sum error signal which is initially generated by parity check device 38. Control block 158 is associated with a control error signal which is initiated by parity check unit 46.

Control register 72 is a shift register which has a shift data input channel 73. Register 72 also has a control channel 75 which controls the shifting function of the shift register by operating the gate data shift control 81. Output register 100 is a serial shift output register in which data is captured in parallel form but shifted out upon command in serial fashion. Output register 100 contains control status flags 200, 202, 204, 206, 207, 208, 209, 210, 212 and 214. Data is captured in data capture registers 216, 218 and 220. Data capture registers 218 and 220 receive their input data directly from registers 132 and 134, respectively. Register 216 is a multiplex register which can select the data it captures from either multiplex register 52 or from register 130. A select network control 222 is provided to control the operation of multiplex register 216. Select network 222 receives control input signals from register positions 77 and 79 of register 72, which is the selection override control from an external command to the system. The other input to select network 222 is a previous error signal received from control block 95 as the result of the operation of OR gate 94. OR gate 96 operates from control 95 to set error flag 206 showing an internal error.

Output signals from the data capture system include a hold source signal out, representative of a parity error in one of input registers 14, 18 or 22, representing the fact that input data was in error. Channel 242 is the channel from which the register contents are shifted out. Channel 244 is a hold source channel into the data capture logic system, indicating that the succeeding VLSI chip device received an error signal and that this VLSI device should capture its output data for error analysis. OR gate 246 receives signals from the various control blocks, as shown, and produces a data captured signal on output line 248. When a data captured signal appears on line 248, register 250 is set, holding up the error captured signal on output line 248 and thus locking in the data in the output register 100. This register is cleared by the process of shifting the data out so that when the data is removed, the data capture logic is ready to begin checking again.

The system according to the present invention operates in the following fashion. The essential concept of the data capture system is that data will be selected into the output registers 100 and captured at a specific time determined by the control logic. The exact use is controlled by the status of the input register 72. The different modes of operation are as follows:

1. Capture of failed operand and its input operands. The normal use of this logic is to capture either solid or intermittent failures that cause parity errors. The parity error signal will cause the operands, which immediately preceded the failing logic, and which were error free, to be captured into the output register 100 along with the failing data. The maintenance hardware can then shift the data out of the register and analyze the error.
2. Modified capture of failing data. If the default operands for an error are not sufficient to diagnose the failure, the input register 72 can be loaded with multiplexer selection values that would capture data other than the default data specified by the hardware. These multiplexer selection values would operate registers 132 and 134, as well as register 216, for example.
3. Internal array data inspection. Some failures or design errors will not cause parity errors. In these cases, the data capture logic can be used to capture operands, specified by the input register 72, at a specific time. The timing of the capture control can be through a bit set in the soft control memory 42 or from an external timing signal. These signals can be further delayed by the delay control block 78 in the input register which is connected with the capture mode select and delay device 50. The use of this function on a looping test can provide data for use in logic analysis.
4. Array testing. The complexity of testing large arrays can be reduced by making internal nodes visible outside of the array. The data capture logic can be used in a test mode to shift internal data out of the array during array testing.

The output of the data capture logic system not only provides the appropriate operand values when a failure mode occurs, but it also provides information as to where and what type of failure was detected. For example, if a parity failure has occurred, the output will indicate at which level of logic the parity error occurred.

The data capture logic system has a number of benefits which include the ability to capture intermittent failing data when the failure occurs and still allow correct data to pass through the system. At the time of a data failure, both the failed data and inputs to the failing logic can be captured. One of the significant features of the data capture logic system is the flexibility in capturing data from error signals, from internal control signals, or from an external control signal line. These non-error capture signals can also be delayed based on a value in input register 72. The system also has the flexibility to provide an override operand selection to replace the default operands at the time of a failure.

Finally, because all data for either logic purposes or control purposes is shifted into the data logic capture system in a serial shift fashion, comparatively few additional pins are needed on a logic chip to implement this system.

The design of a data capture logic system is tailored to the particular logic of a particular VSLI chip. The present embodiment, as described in this specification, is only a very general case, but shows the method that would be implemented for any logic system. First, an analysis is made of the logic array with which the system is to be associated. This analysis shows where the detectible faults in the logic would occur. A chart is then formed which indicates the data operands to be reported with each particular type of fault and the priority with which multiple faults are to be evaluated. It is particularly useful that the present system can deal with a logic array in which more than one fault can occur, but the system reports the priority fault selected by design. However, the system can be used to report other faults than those selected by the default priority. A particularly useful function of the data capture logic system is the "Hold Source" function. When the data capture logic detects an error on the first rank of operand registers of the array, no valid data is available by which the logic array can isolate the failure. In these cases, the "Hold Source" signal is sent to the sending array and the outputs of that array are captured. This allows for the detection of an error which may be represented by the interconnection of one or more logic arrays and the interconnection system.

Another significant feature of the data capture logic system is that it does not save all data in a logic array. If all data in a logic array is saved, unnecessary data or correct data might be saved, but it would all have to be analyzed. The data capture logic performs an automatic data reduction function by reducing the captured data to only that data representing a failure mode or that representing preselected data. This saves considerably in the error analysis if unneeded data is not present. Thus, data reduction can take place at all error operand delay ranks. If an error is not detected at a certain point, the original operand is discarded, unless for some reason according to the logic system, it is needed elsewhere. The system used as an example shows data reduction but does not show the benefit of this data reduction function as much as would occur in a very large and complex array. For purposes of this specification, however, the showing of an array with numerous additional registers and other functions would merely be redundant. Yet it can be seen even from the present example that only certain registers have data passed externally to the system. As logic within the VLSI array increases, more data is discarded at each rank and the improvement over a system which shifts all data out of the array becomes more obvious. This particular system is designed to capture the earliest error in a pipeline data path. When there is more than one error possible at a single time clock or data cycle, the selection network can be designed to give a priority to certain errors.

Another feature of the present invention is referred to as the "capture mode select" function. The function is controlled by the 2 bit signal sent from register 76 to capture mode select logic circuit 50 with respect to use of the external capture signal on line 70 and the signal from soft control memory 42. The capture mode select function can be defined as follows:

| Code Value | Function |
| --- | --- |
| 00 | no operation/disabled |
| 01 | delay triggered on soft control signal only |
| 10 | delay triggered by external signal only |
| 11 | delay triggered by an AND of the soft control signal and the external signal |

With respect to FIGS. 1A and 1B, the following information explains notes in the drawing.

The symbol "PC" on devices 24, 26, 38, 46, etc., stands for parity checker.

Triangle symbol 2 on device 200 stands for "redundant array checksum error."

Triangle symbol 3 on device 202 stands for "forced data capture."

Triangle symbol 4 on device 204 stands for "uncertain source of error."

Triangle symbol 5 on device 206 stands for "internal error detected."

Triangle symbols 6-11 are error flags standing, respectively, for:
6: operand A error
7: operand B error
8: control code error
9: sum error
10: control error/reloadable soft control error
11: output error Triangle symbols 12, 13 and 14 represent registers for captured data. The following table shows the default data capture values associated with the registers:

| Error Type | Register 12 Operand A | Register 13 Operand B | Register 14 Operand C |
| --- | --- | --- | --- |
| operand A error | operand A | data capture | data capture |
| operand B error | data capture | operand B | data capture |
| control code | data capture | data capture | control code |

-continued

| Error Type | Register 12 Operand A | Register 13 Operand B | Register 14 Operand C |
| --- | --- | --- | --- |
| error | | | |
| sum error | operand A | operand B | sum |
| control error | data capture | control | control code |
| output error | output results | control | sum |
| redundancy check | output results | control | sum |
| hold source | output results | control | sum |

What is claimed is:

1. A data capture logic system to be associated with a VLSI logic array having a plurality of data registers comprising:
   a control register means for holding various input data representing control functions for selecting the data capture mode,
   a plurality of error detection means connected to receive and analyze the output of the data register associated with it and where said means detects errors in operands occurring in the VLSI logic array under test, and generates signals indicative of the type of error detected,
   a plurality of data capture register means, each of which is connected to receive the output of a data register in said VLSI array so as to hold a selected operand from the logic array under test and provide that operand as its output, said data capture register means being of at least two types, type 1 always providing as output, its input, type 2 receiving a register output specified from a plurality of registers' output responsive to a control function provided either directly or indirectly from said control register means and said error detection means,
   an output data capture register means connected to said data capture register means having a control portion means (connected to receive said indicative signals), and a data portion means (connected to receive output from said data capture register means) wherein said control portion means holds control signals representative of an indication of the type of data failure which has occurred and wherein said data operand portion means contains selected failed data received from said data capture registers.

2. The data capture logic system of claim 1 and further comprising:
   a soft control memory means connected to an input register for holding predetermined values of operands for determining the data capture functions to be performed,
   a capture mode select and delay device connected to receive signals from said soft control memory means and from said control register and connected to at least one of said data capture register means so that predetermined operands can be capture at preselected times.

3. The data capture logic system of claim 2 and further comprising:
   at least one multiplex data capture register means which can select possible captured operands from a plurality of data registers,
   select network means associated with said multiplex data capture register means for controlling which data operand is selected for capture, said select network means being connected to and responsive to said control register, said capture mode select and delay device and said error detection mechanisms for selecting which operand is to be captured by the associated multiplex data capture register means.

4. The data capture logic system of claim 1 wherein said control register means has means for storing a selection override enable signal and further comprising at least one multiplex data capture register means connected to receive more than one data operand and connected to said control register means to receive said override enable signal so that said multiplex data capture register means can be controlled to capture a different data operand from a different data register than would normally be captured.

5. The data capture logic system of claim 1 wherein said control register means has means for storing a selection override value signal and further comprising at least one multiplex data capture register means connected to receive more than one data operand and a select network connected to said control register means to receive said override enable signal so that said multiplex data capture register means is responsive to said select network to capture a different data operand in response to said preselected value from a different data register than would normally be captured.

6. The data capture logic system of claim 1 and further comprising means for producing an output hold source signal indicative of an error in input operands so that a device preceeding the VLSI logic array can capture data.

7. The data capture logic system of claim 1 and further comprising:
a capture mode select and delay device connected to receive signals from said control register and connected to control at least some of said data capture register means, wherein said control register means has means for storing a capture delay select control signal for controlling said capture mode select and delay device to cause at least some of said data capture register means to capture data operands at a preselected time different from the time at which other of said data capture register means capture data operands.

8. The data capture logic system of claim 1 and further comprising:
a capture mode select and delay device connected to receive signals from said control register and connected to control at least some of said data capture registers, wherein said control register has means for storing a capture delay select control signal for controlling said capture mode select and delay device to cause at least some of said data capture registers to capture data operands at a preselected time different from the time at which other of said data registers capture data operands.

9. The data capture logic system of claim 8 and further comprising a soft control memory means connected to an input register for holding predetermined values of data operands for determining the data capture functions to be performed, said soft control memory being connected to control said capture mode select and delay device.

10. A data capture logic system to be associated with a VLSI logic array comprising:
a plurality of logic error detection circuits connected to logic elements in said logic array and producing output logic error signals when an error occurs,
a control register means for holding various input data representing control functions for configuring the data capture mode logic,
a soft control memory means for holding predetermined values for determining (depending on the mode selected) the time a data capture function is to be performed on the occurence of a detected error or for determining the selected time of a data capture function to be performed when no error is detected,
a capture mode select and delay device connected to receive signals from said soft control memory means and from said input register means to determine a forced data capture when no error is detected,
a plurality of data capture stage means, each of which has one or more registers for holding selected operands from the logic array under test and selected control status flags, wherein said control status flags receive control signals from said input register means, said soft control memory means, said capture mode and select and delay system, and said logic error detection circuits,
multiplexer control means for selecting which operand of several predetermined operands is selected by at least one of said data capture stage means,
an output data cpature operand register means having a control portion means and a data portion means wherein said control portion means holds control signals representative of an indication of the type of data failure which has occurred (derived from said logic error signals) and wherein said data operand portion means contains selected failure data operands received from said plurality of failed data operand registers.

11. The data capture logic system of claim 10 wherein said logic error detection circuits are parity check circuits.

12. The data capture logic system of claim 10 wherein said control register means has means for storing a selection override enable signal and further comprising at least one multiplex data capture register means connected to receive more than one data operand and connected to said control register to receive said override enable signal so that said multiplex data capture register means can be controlled to capture a different data operand from a different data register than would normally be captured.

13. The data capture logic system of claim 10 wherein said control register means has means for storing a selection override value signal and further comprising at least one multiplex data capture register means connected to receive more than one data operand and a select network connected to said control register means to receive said override enable signal so that said multiplex data capture register means is responsive to said select network to capture a different data operand in response to said preselected value from a different data register means than would normally be captured.

14. The data capture logic system of claim 10 and further comprising means for producing an output hold source signal indicative of an error in input operands so that a device preceeding the VLSI logic array can capture data.

15. The data capture logic system of claim 10 and further comprising:
hold source control means for receiving an input hold source control signal indicative of an output operand error, said hold source control means connected to said output data capture register means to cause said output data capture register to capture data operands.

16. In a VLSI circuit the method of capturing and providing for analysis errors in processing input operands comprising at least the following steps:
(a) capturing all input operands which feed an operation circuit,
(b) analyzing the output of the operation for error condition, and generating an indication signal representative of the type of error condition if present,
(c) on error condition presence forwarding all captured operands to an output register means together with the indication signal and the operation result in such a way that the indicator signal, input operands, and operation result are available for analysis or,
(d) on no error condition present in said operation output, allowing said operation output to continue to the next predetermined VLSI circuit operations circuit or output whichever the case may be,
(e) wherein steps c or d are repeated for each operations circuit in the VLSI circuit until an error condition is found or all predetermined to be operational operations circuits are traversed and output of a final result from the VLSI occurs.

17. The method set forth in claim 16 wherein the output of any operations circuit and its input operands may be directed by a control circuit means to be forwarded to the output register means of step c.

18. The method of claim 16 wherein the output of any operations circuit and its input operands may be directed by a control circuit means to be forwarded to the output register means of step c.

* * * * *